United States Patent [19]

Miyatake

[11] Patent Number: 4,672,455
[45] Date of Patent: Jun. 9, 1987

[54] SOLID-STATE IMAGE-SENSOR HAVING REVERSE-BIASED SUBSTRATE AND TRANSFER REGISTERS

[75] Inventor: Shigehiro Miyatake, Osaka, Japan

[73] Assignee: Sharp Kabushiki Kaisha, Osaka, Japan

[21] Appl. No.: 770,043

[22] Filed: Aug. 28, 1985

[30] Foreign Application Priority Data

Aug. 28, 1984 [JP] Japan .................. 59-181285

[51] Int. Cl.$^4$ ............................................. H04N 3/14
[52] U.S. Cl. ..................... 358/213.31; 358/213.19; 358/213.24
[58] Field of Search ............. 357/24 LR; 358/213, 358/212

[56] References Cited

U.S. PATENT DOCUMENTS 4,412,236 10/1983 Sasano et al. .............. 357/24 LR
4,481,522 11/1984 Jastrzebski et al. .......... 357/24 LR
4,486,787 12/1984 Gocho et al. ................. 358/213
4,498,013 2/1985 Kuroda et al. .............. 357/24 LR
4,527,182 7/1985 Ishihara et al. ............. 357/24 LR

FOREIGN PATENT DOCUMENTS 60-79773 5/1985 Japan .
2054961 7/1980 United Kingdom .

OTHER PUBLICATIONS

IEEE International Solid State Circuits Conference, "An Interline Transfer CCD Imager", vol. 27, pp. 32, 33, Matsunaga et al.
IEEE Transactions on Electron Devices, "Interline CCD Image Sensor with an Antiblooming Structure", vol. ED-31, No. 1, pp. 83-88, Ishihara et al.
IEEE Transactions on Electron Devices, "An Interline CCD Image Sensor with Reduced Image Lag", vol. ED-31, No. 12, pp. 1829-1833; Teranishi et al.

Primary Examiner—Gene Z. Rubinson
Assistant Examiner—Stephen Brinich
Attorney, Agent, or Firm—Birch, Stewart, Kolasch & Birch

[57] ABSTRACT

A solid-state image sensor having a plurality of unit cells, each of which includes a photosensitive area and a CCD register for the transfer of a signal charge generated in said photosensitive area, both the photosensitive area and the CCD register are disposed on a layer, having a different polarity from the charging polarity of a signal charge, which is disposed on a substrate having the same polarity as the signal charge.

6 Claims, 3 Drawing Figures

SOLID-STATE IMAGE-SENSOR HAVING REVERSE-BIASED SUBSTRATE AND TRANSFER REGISTERS

BACKGROUND OF THE INVENTION

1. Field of the invention:

This invention relates to a solid-state image sensor, especially an interline CCD image sensor (i.e., an interline coupled charge device image sensor), which can be made compact and which can suppress both blooming and smear.

2. Description of the prior art:

Although solid-state image sensors are advantageous over pick-up tubes in compactness, minimization of the weight, durability, reliability, exhibiting no burn-in from intense overloads, etc., they give rise to blooming and smear which do not arise in pick-up tubes. Blooming occurs when excess signal charges in the photodiode overflow into the transfer channel, resulting in distinct white lines on the obtained image, while smear takes place when a signal charge generated deep inside the substrate diffuses into the transfer channel, resulting in indistinct white lines on the obtained image. Blooming can be eliminated by means of overflow drains composed of an n+-diffusion layer which absorb excess charges, as disclosed by W. F. Kosonocky et al., "Control of Blooming in Charge-Coupled Imagers", RCA Review, vol. 35, pp 3-24, March 1974. However, the problem of smear has not yet been solved.

The above-mentioned approach for the elimination of blooming sacrifices photosensitivity and dynamic range because the active area is reduced, and accordingly a method for the transfer of the excess charges into the substrate has been proposed by Y. Ishihara et al., "Interline CCD Image Sensor with an Antiblooming Structure", IEEE Transactions on Electron Devices, vol. ED-31, No. 1, January 1984. FIG. 3 shows a unit cell of the interline CCD image sensor described in the above-mentioned article, wherein an n⁻-layer 3 constituting a buried channel of the vertical CCD register is formed on a thick p-type layer 13, while an n-type layer 14 constituting a p-n junction photodiode as a photosensitive area is formed on a thin p-type layer 12. Both the thick p-type layer 13 and the thin p-type layer 12 are positioned on an n-type substrate 1. A transfer gate region 7 positioned between the n⁻-layer 3 and n-type layer 14 contains the part of the p-type layer which has not undergone depletion. This unit cell is electrically isolated from adjacent unit cells by channel stops 6 composed of p+-layers formed in the surroundings thereof. On the n⁻-layer 3 and the transfer gate region 7, a polysilicon electrode 9, which is an electrode for the vertical CCD register to be driven by pulses $\phi v$ fed to the electrode 9, is formed. On the polysilicon electrode 9, an Al film 10 is further formed as a photoshield.

A reverse bias voltage is applied between the channel stops 6 and the n-type substrate 1, resulting in a complete depletion of the thin p-type layer 12.

The pulses $\phi v$ have three levels, $V_H$ (high), $V_M$ (middle) and $V_L$ (low). When the pulses $\phi v$ are between the $V_M$ and $V_L$ levels, the n⁻-layer 3 constituting one half of one stage of the vertical CCD register area is isolated from the n type layer 14 constituting the photosensitive area by the transfer gate region 7 containing a part of the p-type layer. When the pulses $\phi v$ are at the highest potential $V_H$, a signal charge is accumulated into the photosensitive area and transferred from the photosensitive area into the vertical CCD register area through the transfer gate region 7, and the potential of the n-type layer 14 constituting the photosensitive area results in a level equal to the surface potential of the transfer gate region 7. This signal charge is further transferred to a horizontal CCD register (not shown) to be read out at a gated charge detector (not shown).

As the photogenerated signal charge is accumulated into the n-type layer 14, the potential of the n-type layer 14 decreases. The excess charges generated in the n-type layer 14 receiving intense illumination thereto are transferred from the n-type layer 14 into the n-type substrate 1 through the thin p-type layer 12 which has been depleted, resulting in a suppression of blooming.

As mentioned above, the conventional image sensor shown in FIG. 3 can suppress blooming, but it still has the following serious problems:

The first problem is that the image sensor cannot be made compact because of the transverse expansion of the thick p-type layer 13. The size of the unit cell cannot be minimized beyond a certain extent in the transverse direction because the size of the thin p-layer 12 is essential to a certain extent.

The second problem is that smear takes place unavoidably when a signal charge generated in the non-depletive thick p-type layer 13 diffuses into the vertical CCD register and mixes with the signal charge in the vertical CCD register.

SUMMARY OF THE INVENTION

The solid-state image sensor of this invention which overcomes the above-discussed and numerous other disadvantages and deficiencies of the prior art, has a plurality of unit cells, each of which comprises a photosensitive area and a CCD register for the transfer of a signal charge generated in said photosensitive area, both said photosensitive area and said CCD register are disposed on a layer, having a different polarity from the charging polarity of said signal charge, which is disposed on a substrate having the same polarity as said signal charge.

The photosensitive area has, in a preferred embodiment, the same polarity as said signal charge. The impurity concentration in the region of the outer surface of said photosensitive area is, in a preferred embodiment, higher than that in the region of said photosensitive area facing said substrate. The region of the outer surface of said photosensitive area is, in a preferred embodiment, formed by a self-alignment technique using, as a mask, an electrode for said CCD register.

The region of the outer surface of said photosensitive area contains, in a preferred embodiment, a layer having a different polarity from the charging polarity of said signal charge and the region of said photosensitive area facing said substrate contains a layer having the same polarity as said signal charge.

Depletion is, in a preferred embodiment, attained not only in the region of said layer positioned between said substrate and said photosensitive area but also in the region of said layer positioned between said substrate and said CCD register by the application of a reverse bias voltage between said substrate and said layer formed on said substrate.

The CCD register is, in a preferred embodiment, composed of a buried channel. In a preferred embodiment, the impurity concentration in the outer surface of said photosensitive area is higher than that in the region of said photosensitive area facing said substrate, and moreover, the formation of the inner layer of said photosensitive area facing said substrate is simultaneous with the formation of said buried channel of the CCD register.

Thus, the invention described herein makes possible the objects of (1) providing a solid-state image sensor which can attain a suppression of not only blooming but also smear; and (2) providing a solid-state image sensor having a compact structure.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
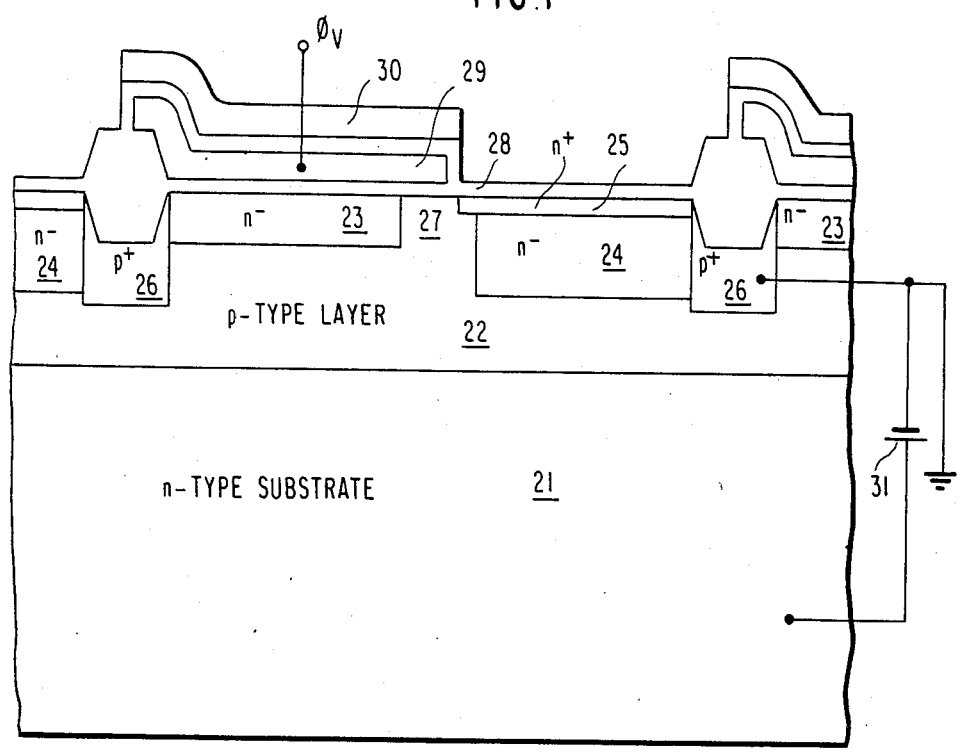
FIG. 1 is a sectional view showing a unit cell of the solid-state image sensor of this invention.

FIG. 1 shows a unit cell of the interline CCD image sensor of this invention, which comprises an n-type substrate 21, a p-type layer 22 formed on the n-type substrate 21, one half of one stage of a vertical CCD register which is composed of a buried channel constituted by an $n^-$-layer 23 formed on the p-type layer 22, and a photosensitive area which contains a p-n junction photodiode constituted by an $n^-$-layer 24 and an $n^+$-layer 25. The $n^-$-layer 24 is positioned in the region of the outer surface of the photosensitive area, while the $n^+$-layer 25 is positioned in the region of the photosensitive area facing the n-type substrate 21. Since the $n^+$-layer 25 can be formed by a self-alignment technique using, as a mask, a polysilicon electrode 29 for the CCD register, it allows for simplification of the production process of this image sensor. Moreover, since the $n^-$-layer 24 can be formed at the same time as the $n^-$-layer 23 constituting the buried channel, it allows for simplification of the production processes of this image sensor.

Alternatively a thick $n^+$-layer 25 alone can be disposed without the $n^-$-layer 24, although the resulting image sensor is inferior in photosensitivity to short wavelengths, as the thick $n^+$-layer 25 contains a high impurity concentration.

A transfer gate region 27 containing a part of the p-type layer is positioned between the $n^-$-layer 23 and the $n^+$-layer 25. This unit cell is isolated from adjacent unit cells by channel stops 26 composed of $p^+$-layers formed in the surroundings thereof. On the $n^-$-layer 23 and the transfer gate region 27, the polysilicon electrode 29 functioning as an electrode for the CCD register which is driven by pulses $\phi v$ fed to the electrode 29 is disposed through an insulating film. On the polysilicon electrode 29, an Al film 30 is disposed as a photoshield.

A reverse bias voltage is applied between the channel stop 26 and the n-type substrate 21, resulting in complete depletion not only in the region of the p-type layer positioned between the substrate 21 and the CCD register, but also in the region of the p-type layer positioned between the substrate 21 and the photodiode area.

The introduction of the pulses $\phi v$ (having three potential levels, $V_H$, $V_M$, and $V_L$) into the polysilicon electrode of the image sensor of this invention having the above-mentioned structure, the reading out of a signal charge at a gate transfer detector, the control of the transfer of the signal charge into the CCD register, and the control of the accumulation of the signal charge in the photosensitive area are attained in the same manner as for a conventional image sensor. Since the region of the p-type layer positioned below the photodiode area has been depleted, excess charges generated in the photodiode area receiving intense illumination are transferred from the photodiode area into the n-type substrate 21 through the $n^-$-layer 24 and the p-type layer 22 in the same manner as the conventional image sensor in FIG. 3. Due to the above-mentioned particular structure of the image sensor of this invention, the region of the p-type layer 22 positioned below the $n^-$-layer 23 is also depleted and charges generated deep inside said region can be transferred from said region into the n-type substrate 21 without diffusion of the charges into the CCD register, so that smear can be completely suppressed. Moreover, the transverse expansion of the thick p-type layer required in a conventional image sensor is not required in above-mentioned image sensor of this invention, so that compactness of the image sensor can be achieved.

Figure 2:
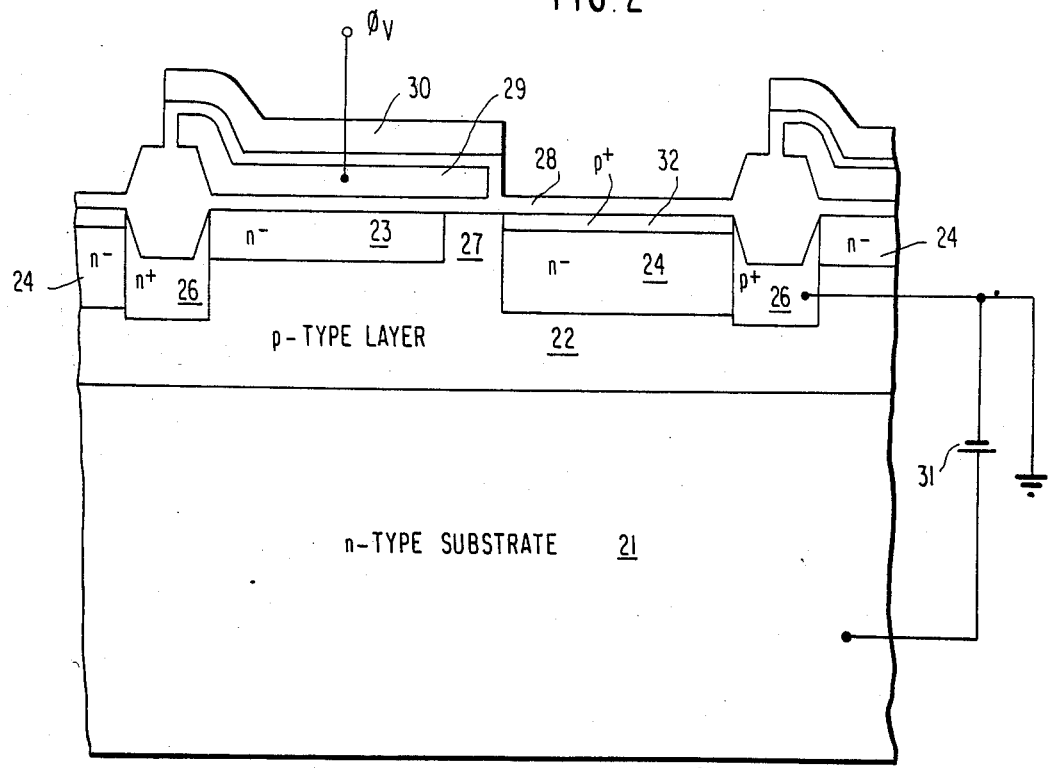
FIG. 2 is a sectional view showing another unit cell of the solid-state image sensor of this invention.

FIG. 2 shows another unit cell of the interline CCD image sensor of this invention, which has the same structure as the unit cell of the image sensor shown in FIG. 1, except that a $p^+$-layer 32 is employed instead of the $n^+$-layer 25 which constitutes the region of the outer surface of the photosensitive area. This image sensor shown in FIG. 2 operates in the same manner and attains the same effects as that shown in FIG. 1, except that when the pulses $\phi v$ are at the highest potential level $V_H$ and the signal charge accumulated in the photosensitive area is read out at the horizontal CCD register, the $n^-$-layer 24 must be completely depleted because the $p^+$-layer 32 is formed with a high impurity concentration and positioned at the same potential as the $p^+$-channel stop layer 26.

As mentioned above, each of the unit cells of image sensor according to this invention is designed in a manner to form both the buried channel CCD register of the $n^-$-layer constituting the transfer area and the photodiode constituting the photosensitive area on the same p-type layer disposed on the n-type substrate, so that excess charges generated in the photodiode receiving intense illumination can be transferred from the photodiode into the n-type substrate through the depleted region of the p-type layer therebetween, resulting in a suppression of blooming. Moreover, since the region of the p-type layer positioned between the CCD register and the n-type substrate is depleted, charges generated deep inside the depleted region of the p-type layer do not diffuse into the CCD register, resulting in a suppression of smear.

Figure 3:
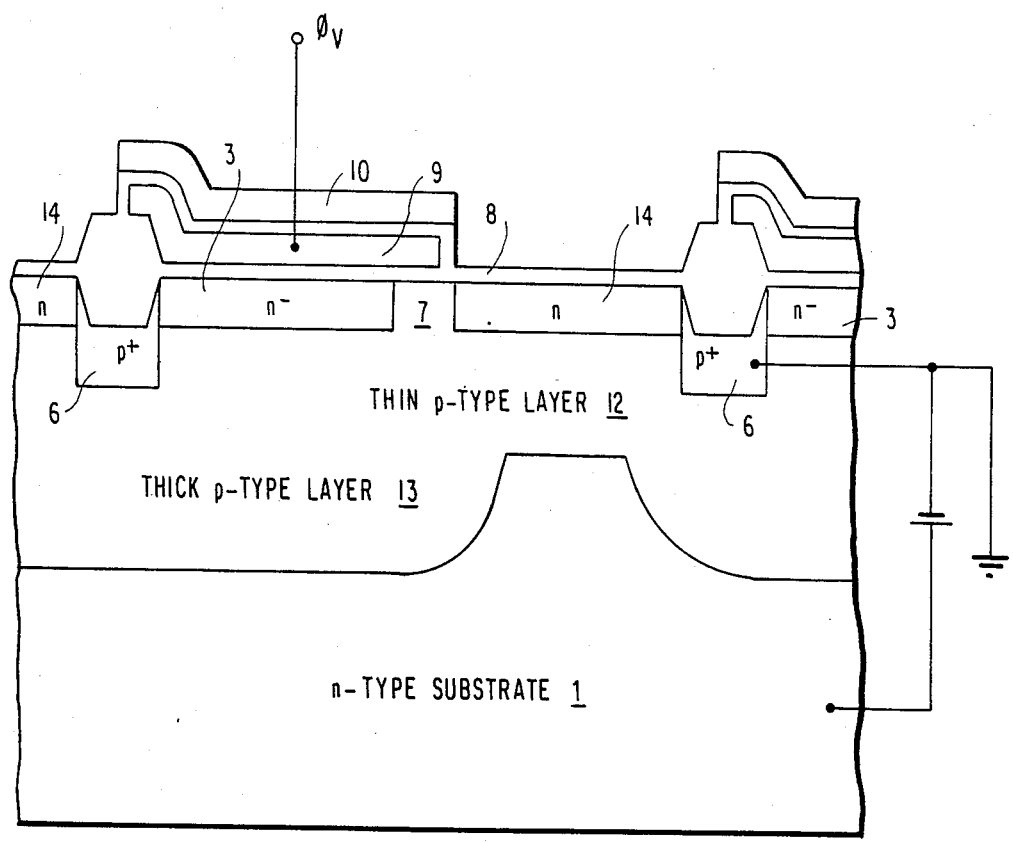
FIG. 3 is a sectional view showing a conventional unit cell of the interline CCD image sensor.

Since the image sensor of this invention has only one p-type layer 22, on which both the CCD register and the photodiode are formed, and does not have such thick p-type layer 13 expanding transversely as in the conventional image sensor in FIG. 3, it can be made compact, although the conventional image sensor cannot be made compact because of the transverse expansion of the said thick p-type layer 13.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A solid-state image sensor having a plurality of unit cells, each of which comprises a photosensitive area and one half of one stage of a CCD register for the transfer of a signal charge generated in said photosensitive area, both said photosensitive area and said one half of a CCD register are disposed on a first layer, said first layer having a different polarity from the polarity of said signal charge, said layer being disposed on a substrate having the same polarity as said signal charge, regions of said first layer between said substrate and said photosensitive region, and said substrate and said one half of one stage of the CCD register being substantially completely depleted by a reverse bias voltage between said substrate and said first layer.

2. A solid-state image sensor according to claim 1, wherein said photosensitive area has the same polarity as said signal charge.

3. A solid-state image sensor according to claim 2, wherein the impurity concentration in the region of an outer surface of said photosensitive area is higher than that in a region of said photosensitive area facing said substrate.

4. A solid-state image sensor according to claim 1, wherein a region of an outer surface of said photosensitive area contains a second layer having a different polarity from the polarity of said signal charge and a region of said photosensitive area facing said substrate contains a third layer having the same polarity as said signal charge.

5. A solid-state image sensor according to claim 1, wherein said CCD register is composed of a buried channel.

6. A solid-state image sensor according to claim 5, wherein the impurity concentration in an outer surface of said photosensitive area is higher than that in a region of said photosensitive area facing said substrate.

* * * * *